US007055797B2

(12) United States Patent
Yee et al.

(10) Patent No.: US 7,055,797 B2
(45) Date of Patent: Jun. 6, 2006

(54) MICRO-ACTUATOR, FABRICATION METHOD THEREOF, AND MICRO-ACTUATING VALVE

(75) Inventors: Young-Joo Yee, Gyeonggi-Do (KR); Chang-Hyeon Ji, Seoul (KR); Jung-Hoon Choi, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 48 days.

(21) Appl. No.: 10/863,460

(22) Filed: Jun. 9, 2004

(65) Prior Publication Data

US 2004/0251439 A1 Dec. 16, 2004

(30) Foreign Application Priority Data

Jun. 11, 2003 (KR) ............... 10-2003-0037558
Jul. 30, 2003 (KR) ............... 10-2003-0052707

(51) Int. Cl.
*F16K 31/02* (2006.01)
(52) U.S. Cl. ............... 251/129.06; 251/129.01
(58) Field of Classification Search ........... 251/129.01, 251/129.06
See application file for complete search history.

(56) References Cited

U.S. PATENT DOCUMENTS

| 5,647,574 A | * | 7/1997 | Mettner et al. ........ 251/129.06 |
| 6,003,833 A | * | 12/1999 | Tasi et al. ............... 251/11 |
| 6,116,863 A | | 9/2000 | Ahn et al. |
| 6,290,862 B1 | * | 9/2001 | Silverbrook .............. 216/27 |
| 6,523,560 B1 | * | 2/2003 | Williams et al. ............. 137/14 |

2002/0195579 A1  12/2002  Johnson

FOREIGN PATENT DOCUMENTS

| EP | 1 008 765 A2 | 12/1999 |
| EP | 1 031 734 A2 | 8/2000 |
| WO | WO-99/17749 A1 | 4/1999 |

OTHER PUBLICATIONS

W. Benecke, "A Smart Gas Sensing Microsystem", Industrial Electronics, vol. 1, No. 7, Jul. 1998, pp. 263-266.

* cited by examiner

*Primary Examiner*—Edward K. Look
*Assistant Examiner*—John K. Fristoe, Jr.
(74) *Attorney, Agent, or Firm*—Birch, Stewart, Kolasch & Birch, LLP

(57) ABSTRACT

Disclosed are a micro-actuator, a fabrication method thereof, and a micro-actuating valve. The micro-actuating valve comprises: a first valve housing having a fluid entrance at the middle portion thereof; a second valve housing coupled to the first valve housing thus to form a space portion therein and having a fluid exit connected to the fluid entrance of the first valve housing; a plate installed at the space portion and having a micro-channel at one side thereof to be connected to the fluid exit; a plurality of micro-driving members installed to be near the plate for discharging a fluid introduced from the fluid entrance of the first valve housing to the fluid exit of the second valve housing by selectively opening and closing the micro-channel of the plate; a micro-mover suspension installed at the plate for supporting the micro-mover; a coil installed at the micro-mover; a magnet installed with a certain gap from the coil; and an electrode portion formed at the plate for is supplying a power source to the coil.

12 Claims, 17 Drawing Sheets

US 7,055,797 B2

MICRO-ACTUATOR, FABRICATION METHOD THEREOF, AND MICRO-ACTUATING VALVE

This Non-provisional application claims priority under 35 U.S.C. § 119 (a) on Patent Application No(s). 10-2003-0037558 and 10-2003-0052707 filed in Korea on Jun. 11, 2003 and Jul. 30, 2003, respectively, the entire contents of which are hereby incorporated by reference.

BACKGROUND OF THE INVENTION

1. Field of the Invention

The present invention relates to a micro-actuator, a fabrication method thereof, and a micro-actuating valve, and more particularly, to a micro-actuator capable of being driven at a low voltage, a fabrication method thereof, and a micro-actuating valve capable of efficiently controlling a flow amount of a fluid by applying the micro-actuator.

2. Description of the Conventional Art

A linear flow amount controlling valve in accordance with the conventional art has a structure that a valve rod of a needle shape is moved with a certain displacement by converting a rotational force of a step motor into a linear motion. An opened degree of an orifice (a fluid channel) is determined by the motion of the valve rod thus to control a flow amount.

However, the conventional linear flow amount controlling valve for converting a rotational force of a step motor into a linear motion of a valve rod has to maintain a sealed state between a rotational shaft of the step motor and the valve rod. According to this, the fabrication process is difficult and the fabrication cost is increased due to the expensive step motor.

Also, the conventional flow amount controlling valve using a micro-machining technique has a structure that a flap or a diaphragm formed at a fluid channel has to be directly driven in order to control an opened amount of the fluid channel. The conventional flow amount controlling valve has a complicated entire structure and requires a high voltage.

Additionally, the conventional flow amount controlling valve using a solenoid actuator causes a severe noise.

SUMMARY OF THE INVENTION

Therefore, an object of the present invention is to provide a micro-actuator capable of reducing a fabrication cost by simplifying a fabrication process and capable of having a micro-driving at a low voltage.

Another object of the present invention is to provide a micro-actuating valve capable of reducing a fabrication cost and capable of efficiently controlling a flow amount using the micro-actuator that has a micro-driving at a low voltage with a low noise.

Still another object of the present invention is to provide a micro-actuating valve capable of efficiently controlling a flow amount in a digital method by opening a predetermined number of micro-channels of the micro-actuator and by closing the rest number of micro-channels of the micro-actuator.

To achieve these and other advantages and in accordance with the purpose of the present invention, as embodied and broadly described herein, there is provided a micro-actuator according to one embodiment comprising: a first plate having a micro-channel at one side thereof; a second plate fixed to the first plate and having a micro-channel at one side thereof to be connected to the micro-channel of the first plate; and a micro-driving means installed to be near the first plate and the second plate so as to selectively open and close the micro-channel of the second plate.

The micro-driving means includes: a micro-mover flexibly installed at the micro-channel of the second plate; an electrode portion formed at both sides of the micro-mover for supplying a power source to the micro-mover; a plug formed at the end of the micro-mover for opening and closing the micro-channel of the second plate; and a plug suspension for elastically supporting the plug.

The plug suspension is composed of: a fixation portion fixed to the first plate; and a connection portion for connecting the fixation portion and the plug.

A method for fabricating the micro-actuator according to the first preferred embodiment comprises the steps of: a first step of patterning an etching mask for forming a valve plug and a micro-mover at an upper surface of a silicon member having a wafer form and to be used as a first substrate, simultaneously patterning the etching mask for forming a micro-suspension gap at a lower surface of the silicon member, forming a micro-suspension gap by partially etching the silicon member exposed between the etching masks of the lower surface of the silicon member, and then removing the etching mask; a second step of pattering an etching mask for forming a bonding portion and a micro-channel at the lower surface of the silicon member, forming a micro-channel by partially etching the silicon member exposed between the etching masks, and then removing the etching mask; a third step of depositing a conductive thin film at a lower surface of a silicon member having a wafer form and to be used as a second substrate; a fourth step of patterning an etching mask on the conductive thin film for forming an electrode portion, forming an electrode portion by partially etching the conductive thin film exposed between the etching masks, and then removing the etching mask; a fifth step of forming a micro-channel at the silicon member of the fourth step; a sixth step of bonding the silicon member of the second step and the silicon member of the fifth step by an alignment; a seventh step of forming a valve plug and a micro-mover by partially etching the silicon member exposed between the etching masks patterned at the upper surface of the silicon member of the first step up to the bonding part of the sixth step, then removing the etching mask, and thereby forming a plurality of micro-actuators; and an eighth step of fabricating a micro-actuator array by cutting the micro-actuators as a chip unit.

The micro-actuator array becomes discrete as an N+1 state for the number N of the micro-actuators thereby to control a flow amount.

The micro-actuating valve according to the first embodiment includes: a first valve housing having a fluid entrance at the middle portion thereof; a second valve housing coupled to the first valve housing thus to form a space portion therein and having a fluid exit connected to the fluid entrance of the first valve housing; a first plate installed at the space portion and having a micro-channel at one side thereof to be connected to the fluid exit; a second plate fixed to the first plate and having a micro-channel at one side thereof to be connected to the micro-channel of the first plate; a plurality of micro-driving members installed to be near the first plate and the second plate for discharging a fluid introduced from the fluid entrance of the first valve housing to the fluid exit of the second valve housing by selectively opening and closing the micro-channel of the second plate; an electrode portion formed at both sides of the micro-mover for supplying a power source to the micro-mover; a plug formed at the end of the micro-mover for opening and closing the micro-channel of the second plate; and a plug suspension for elastically supporting the plug.

A micro-actuator according to a second embodiment of the present invention comprises: a plate having a micro-channel at one side thereof; and a micro-driving means installed to be near the plate for selectively opening and closing the micro-channel of the plate.

The micro-driving means includes: a micro-mover for opening and closing the micro-channel of the plate; a micro-mover suspension installed at the plate for supporting the micro-mover; a coil installed at the micro-mover; a magnet installed with a certain gap from the coil; and an electrode portion formed at the plate for supplying a power source to the coil.

A micro-actuating valve according to a second embodiment of the present invention comprises: a first valve housing having a fluid entrance at the middle portion thereof; a second valve housing coupled to the first valve housing thus to form a space portion therein and having a fluid exit connected to the fluid entrance of the first valve housing; a plate installed at the space portion and having a micro-channel at one side thereof to be connected to the fluid exit; a plurality of micro-driving members installed to be near the plate for discharging a fluid introduced from the fluid entrance of the first valve housing to the fluid exit of the second valve housing by selectively opening and closing the micro-channel of the plate; a micro-mover suspension installed at the plate for supporting the micro-mover; a coil installed at the micro-mover; a magnet installed with a certain gap from the coil; and an electrode portion formed at the plate for supplying a power source to the coil.

A gasket is installed at a contact surface between the first valve housing and the second valve housing.

The electrode portion is composed of: an electrode pad connected to the micro-mover; and an electrode feeder connected to the electrode pad and extended towards outside of the first valve housing. The electrode feeder is insulated by an insulating material.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
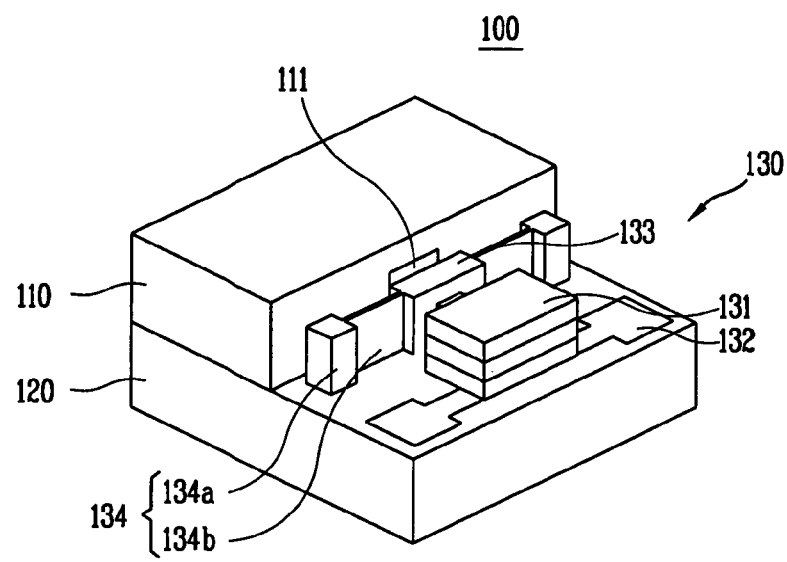
FIG. 1 is a perspective view showing a micro-actuator according to a first embodiment of the present invention.

Reference will now be made in detail to the preferred embodiments of the present invention, examples of which are illustrated in the accompanying drawings.

Hereinafter, a micro-actuator, a fabrication method thereof, a micro-actuating valve according to a first embodiment of the present invention will be explained with reference to FIGS. 1 to 17.

FIGS. 1 to 5 are views showing a micro-actuator according to a first embodiment of the present invention.

As shown, the micro-actuator 100 according to the first embodiment of the present invention comprises: a first plate 110 having a micro-channel 111 at a lower portion thereof; a second plate 120 bonded to a lower portion of the first plate 100 and having a micro-channel 121 at one side thereof to be connected to the micro-channel 111 of the first plate 110; and a micro-driving means 130 installed to be near the first plate 110 and the second plate 120, more specifically installed at an upper surface of the second plate 120 for selectively opening and closing the micro-channel 121 of the second plate 120.

The micro-driving means 130 includes: a micro-mover 131 installed at the upper surface of the second plate 120 to be expanded/contracted towards the micro-channel 111 of the first plate 110; an electrode portion 132 formed at both sides of the micro-mover 131 for supplying a power source to the micro-mover 131; a plug 133 formed at the end of the micro-mover 131 for opening and closing the micro-channel 121 of the second plate 120; and a plug suspension 134 for elastically supporting the plug 133.

The plug suspension 134 is composed of: a fixation portion 134a fixed to the first plate 110; and a connection portion 134b for connecting the fixation portion 134a and the plug 133.

Figure 2:
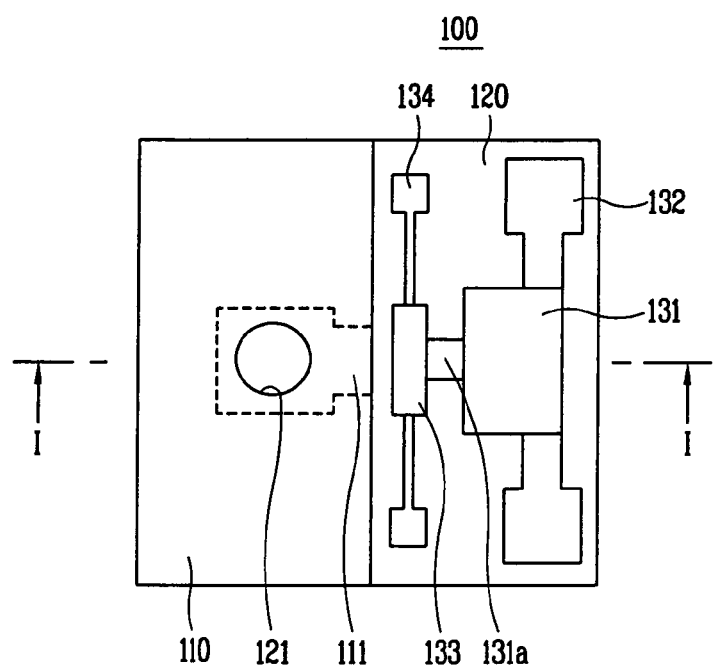
FIG. 2 is a plane view showing a state that a plug opens a fluid channel in the micro-actuator according to the first embodiment of the present invention.
Figure 3:
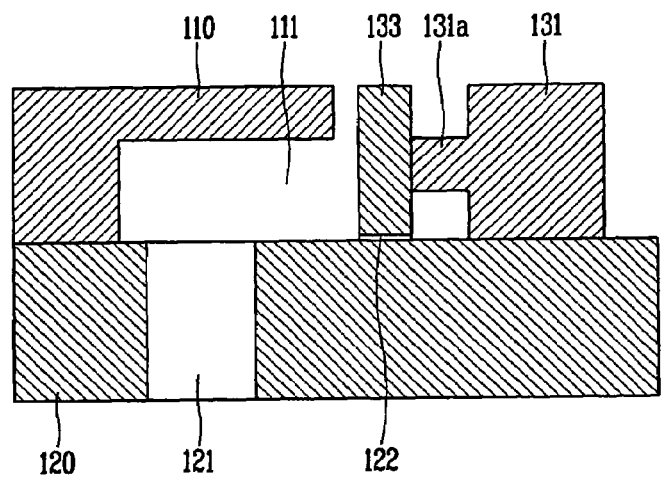
FIG. 3 is a sectional view taken along line I—I of FIG. 2.

In the micro-actuator 100 according to the first embodiment of the present invention, as shown in FIGS. 2 and 3, the plug suspension 134 initially supports the plug 133. At this time, the plug 133 opens the micro-channel 111 of the first plate 110.

Under the state, when a power source is supplied to the electrode portion 132 installed at both sides of the micro-mover 131, a front surface portion 131a of the micro-mover 131 is moved horizontally in drawing by a generated electromotive force. At this time, the plug 133 is moved towards the micro-channel 111 of the first plate 110 thus to close the micro-channel 111. Herein, the plug 133 always maintains a minute gap with the second plate 120 by a micro-suspension gap 122.

Figure 4:
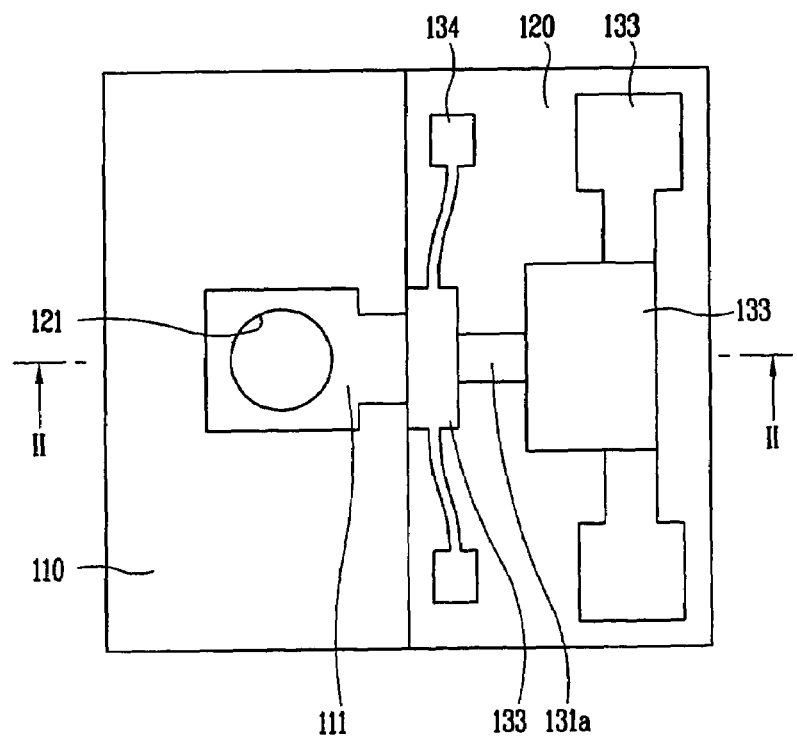
FIG. 4 is a plane view showing a state that a plug closes a fluid channel in the micro-actuator according to the first embodiment of the present invention.
Figure 5:
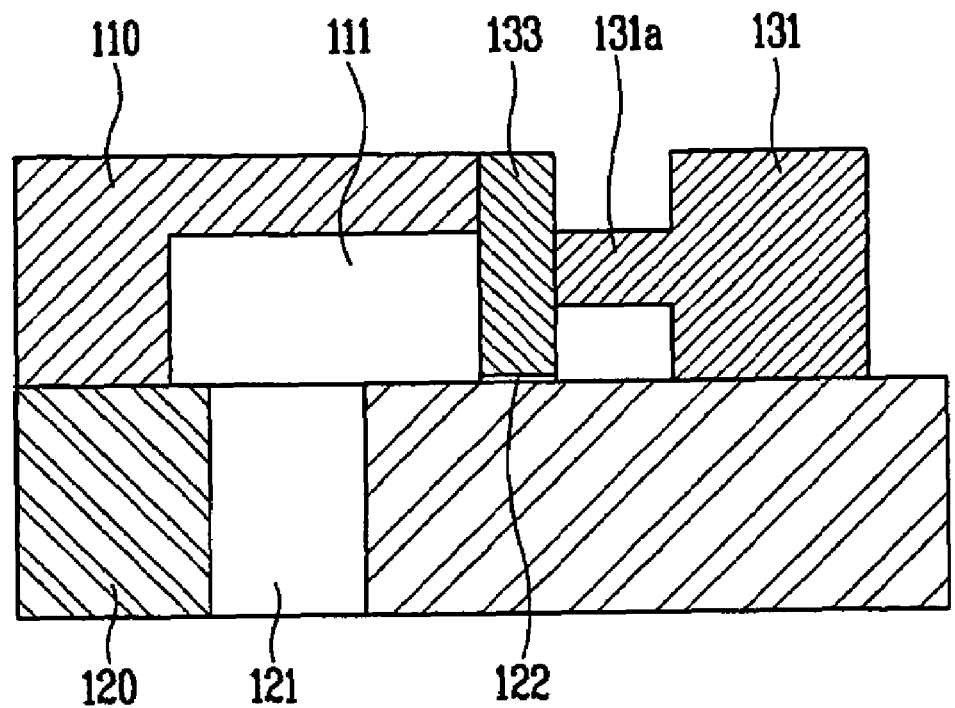
FIG. 5 is a sectional view taken along line II—II of FIG. 4.

As shown in FIGS. 4 and 5, when a power source to the electrode portion 132 of the micro-mover 131 is shielded, the plug 133 is restored to the original position by an elastic restoration force of the plug suspension 134.

Hereinafter, a method for fabricating a micro-actuator according to a first embodiment will be explained with reference to FIGS. 6A to 8C.

As shown in FIGS. 6A to 6D, a silicon member of a wafer form is etched thus to fabricate a first plate in steps of 1~2. Then, as shown in FIGS. 7A to 7D, the silicon member of a wafer form is etched thus to fabricate a second plate in steps of 3~5. Then, as shown in FIGS. 8A to 8C, the second plate is bonded to a lower portion of the first plate thus to complete a micro-actuator array in steps of 6~8.

Figure 6A:
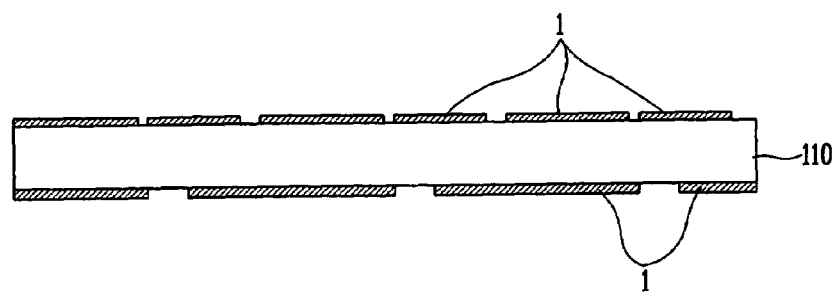
FIGS. 6A to 6D are longitudinal section views showing a fabrication process of a first plate in a method for fabricating a micro-actuator according to the present invention.
Figure 6B:
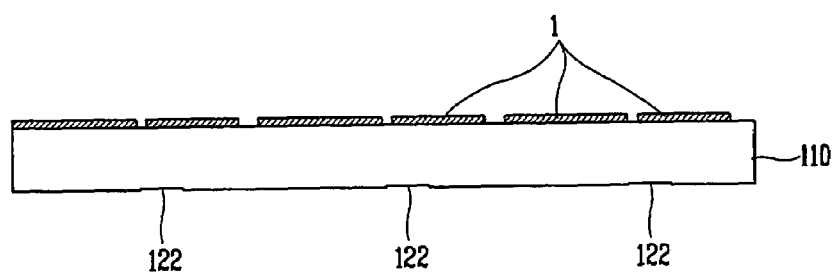

That is, in the first step, an etching mask 1 is patterned in order to form a valve plug and a micro-mover at an upper surface of a silicon member 110, and at the same time, the etching mask 1 is patterned in order to form a micro-suspension gap at a lower surface of the silicon member 110 (Refer to FIG. 6A). Then, the silicon member 110 exposed between the etching masks 1 of the lower surface of the silicon member 110 is partially etched thus to form a micro-suspension gap 122, and then the etching mask 1 is removed (Refer to FIG. 6B).

Figure 6C:
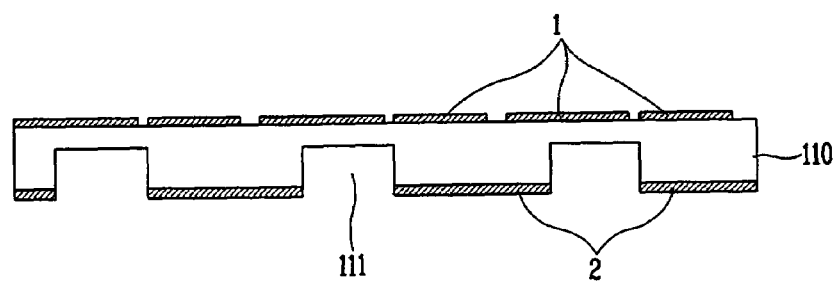
Figure 6D:
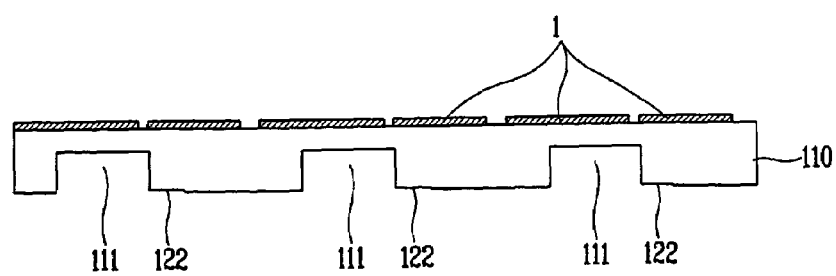

In the second step, an etching mask 2 is patterned in order to form a bonding part and a micro-channel at the lower surface of the silicon member 110 (Refer to FIG. 6C). Then, the silicon member 110 exposed between the etching masks is partially etched thus to form a micro-channel 111, and then the etching mask 2 is removed (Refer to FIG. 6D).

In the third step, a conductive thin film 3 is deposited at an upper surface of a silicon member 120 by a semiconductor device fabricating technique such as a sputtering, an evaporation, a chemical vapor deposition, and etc. (Refer to FIG. 7A).

Figure 7A:
FIGS. 7A to 7D are longitudinal section views showing a fabrication process of a second plate in the method for fabricating the micro-actuator according to the present invention.
Figure 7B:
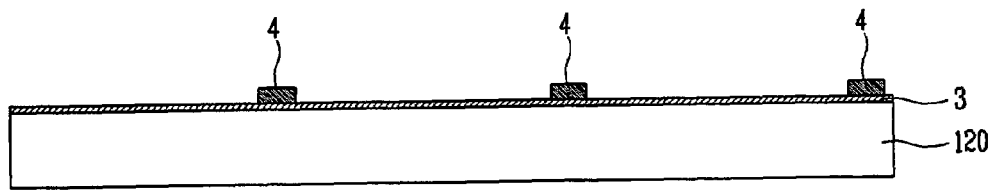
Figure 7C:
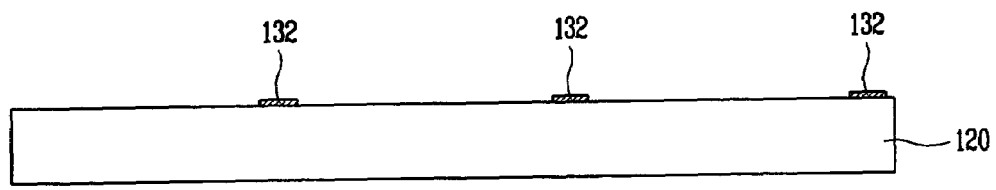
Figure 8A:
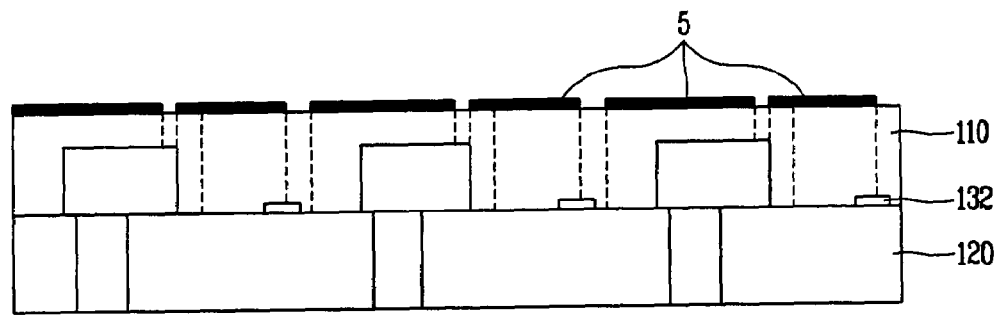
FIGS. 8A to 8C are longitudinal section views showing a bonding between the first plate and the second plate and a fabrication process of a micro-structure in the method for fabricating the micro-actuator according to the present invention.
Figure 8B:
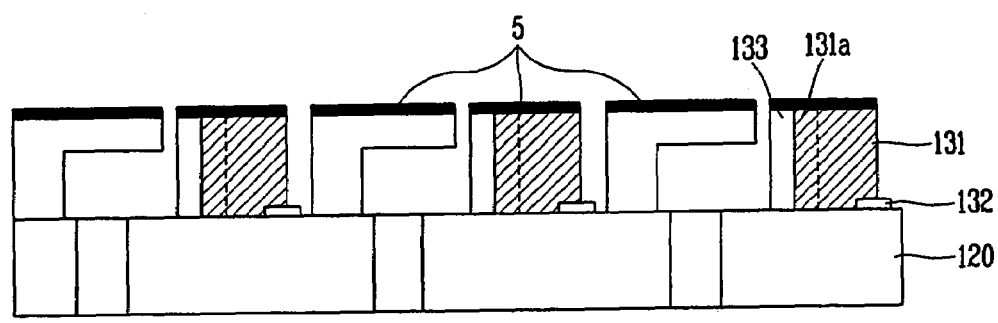
Figure 8C:
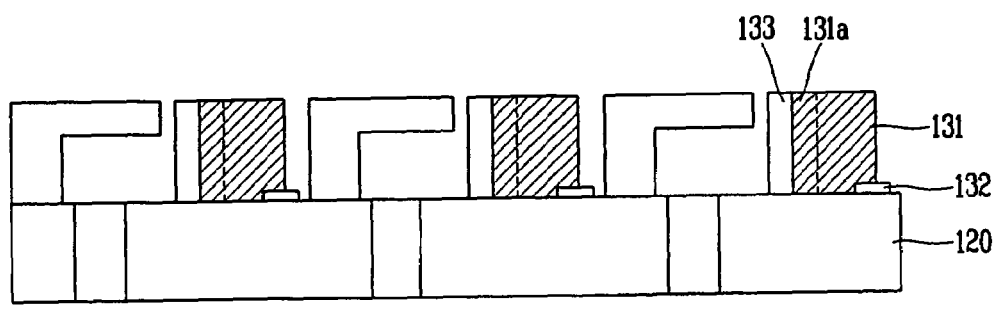

In the fourth step, the an etching mask 4 is patterned on the conductive thin film 3 in order to form an electrode portion 132 (Refer to FIG. 7B). Then, the conductive thin film 3 exposed between the etching masks 4 is partially etched thus to form the electrode portion 132, and then the etching mask 4 is removed (Refer to FIG. 7C).

Figure 7D:
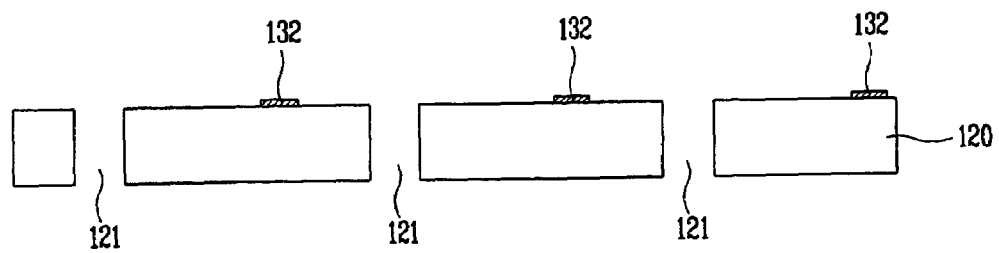

In the fifth step, a micro-channel 121 is formed at the silicon member 120 (Refer to FIG. 7D).

In the sixth step, the silicon member 110 fabricated in the second step and the silicon member 120 fabricated in the fifth step are bonded to each other by an alignment. As the bonding method, one of micro-machining techniques, a silicon glass anodic bonding technique may be applied.

In the seventh step, the silicon member 110 exposed between etching masks 5 patterned at the upper surface of the silicon member 110 of the first step is etched up to the bonding part of the sixth step, thereby forming a valve plug 133, a micro-mover 131, and a front surface portion 131a that connects the valve plug 133 and the micro-mover 131. Then, the etching mask 5 is removed thereby to form a plurality of micro-actuators (Refer to FIGS. 8A to 8C).

Figure 12:
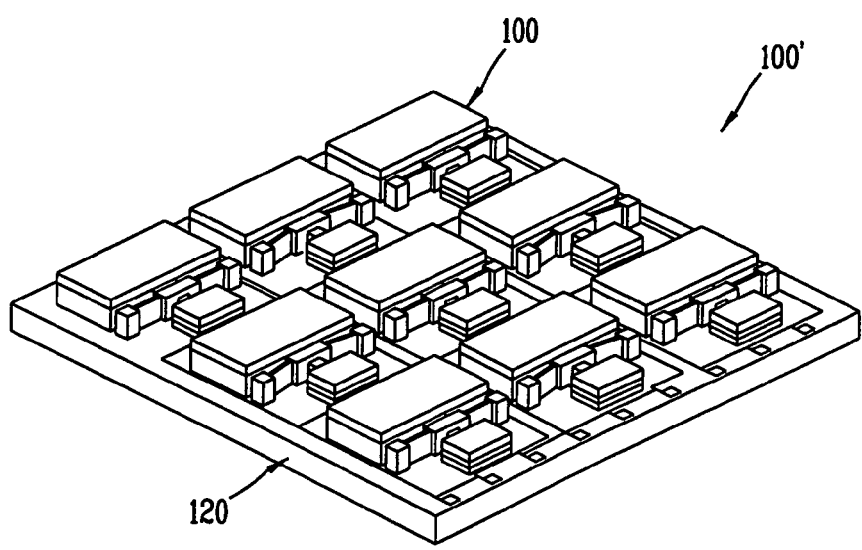
FIG. 12 is a perspective view showing a micro-actuator array that micro-actuators are arranged as 3×3.

In the eighth step, the micro-actuators of a wafer form fabricated in the seventh step are cut as a unit, for example, as 3×3 or 4×4 thereby to fabricate a micro-actuator array (Refer to FIG. 12). The micro-actuators may constitute a micro-actuator array having a specific arrangement in order to be applied to a micro-actuating valve.

Hereinafter, a micro-actuating valve for controlling a flow amount by applying the micro-actuator array will be explained.

Figure 9:
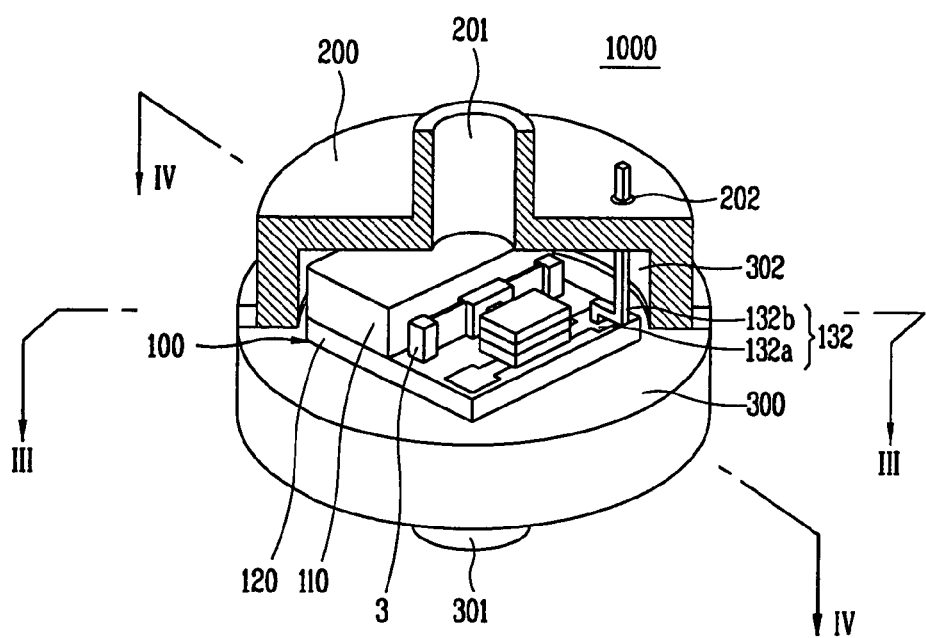
FIG. 9 is a partial cut perspective view showing a micro-actuating valve according to a first embodiment of the present invention.
Figure 10:
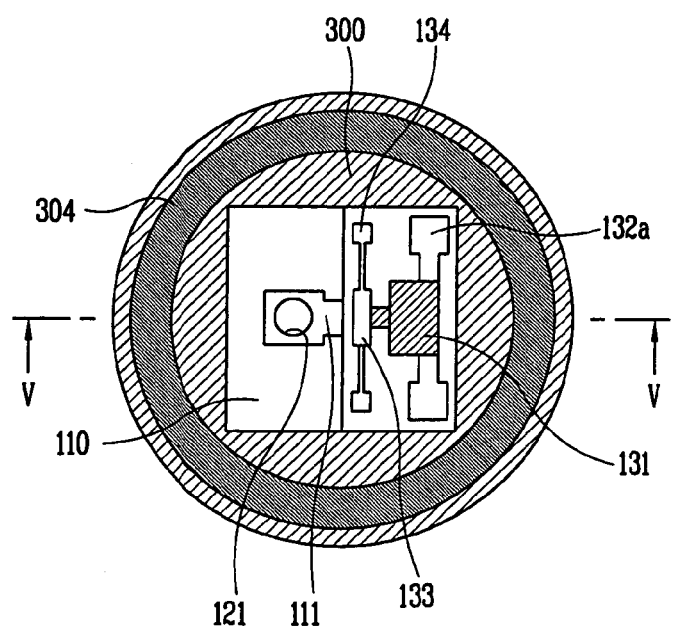
FIG. 10 is a sectional view taken along line III—III of FIG. 9.
Figure 11:
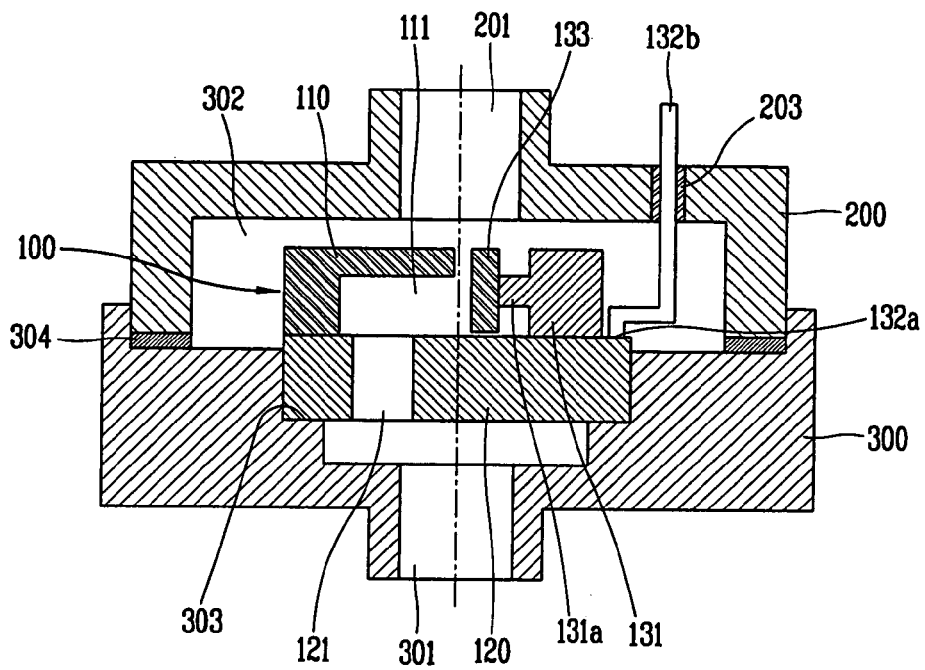
FIG. 11 is a sectional view taken along line IV—IV of FIG. 9.

FIG. 9 is a partial cut perspective view showing a micro-actuating valve according to a first embodiment of the present invention, FIG. 10 is a sectional view taken along line III—III of FIG. 9, and FIG. 11 is a sectional view taken along line IV—IV of FIG. 9.

As shown, a micro-actuating valve 1000 according to the first embodiment comprises: a first valve housing 200 having a fluid entrance 201 at the middle portion thereof; a second valve housing 300 coupled to the first valve housing 200 thus to form a space portion 302 therein and having a fluid exit 301 connected to the fluid entrance 201 of the first valve housing 200; and the aforementioned micro-actuator 100 installed at the space portion 302 for selectively discharging a fluid introduced to the fluid entrance 201 to the fluid exit 301.

The structure of the micro-actuator 100 applied to the micro-actuating valve 1000 is the same as that of the micro-actuator of FIG. 1 thereby to omit its explanation.

A mounting groove 303 for mounting the second plate 120 is formed at the inner surface of the second valve housing 300.

A gasket 304 is installed at a contact surface between the first valve housing 110 and the second valve housing 120 thereby to prevent a fluid from being leaked to the contact surface between the first valve housing 200 and the second valve housing 300.

The electrode portion 132 is composed of: an electrode pad 132a electrically connected to the micro-mover 131; and an electrode feeder 132b connected to the electrode pad 132a and extended towards outside of the first valve housing 200.

The electrode feeder 132b is connected to outside through a penetration hole 202 formed at the first valve housing 200, and an insulating material 203 is formed at the penetration hole 202.

Figure 13:
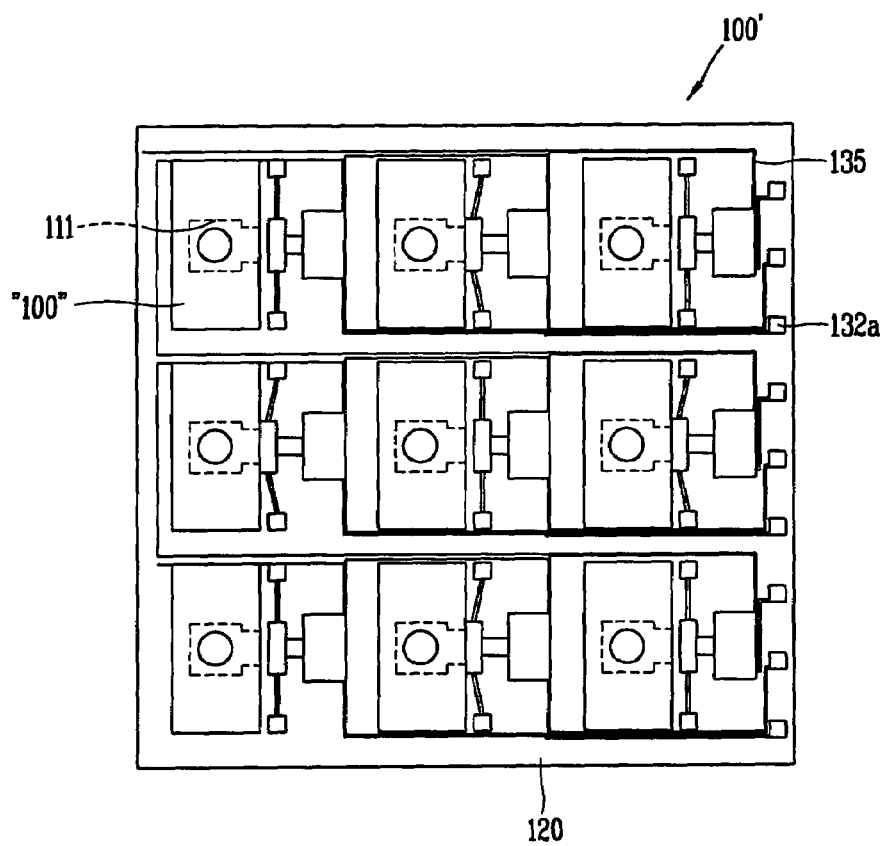
FIG. 13 is a plane view of FIG. 12.

FIG. 12 is a perspective view showing a micro-actuator array that micro-actuators are arranged as 3×3, and FIG. 13 is a plane view of FIG. 12.

As shown, a micro-actuator array 100' has a structure that a micro-actuator 100 is arranged as 3×3 at a predetermined position of the upper surface of one second plate 1120 and each electrode line 135 and the electrode pad 132a are arranged.

As shown in FIG. 13, four micro-actuators among nine micro-actuators are driven thus to close the micro-channel 111 and the rest five micro-actuators are not driven thus to open the micro-channel 111, thereby controlling a flow amount in a digital method.

In the micro-actuator array 100', a flow amount passing through the micro-channel 111 becomes discrete thus to control the flow amount as an N+1 state for the number N of the micro-actuators 100.

Figure 14:
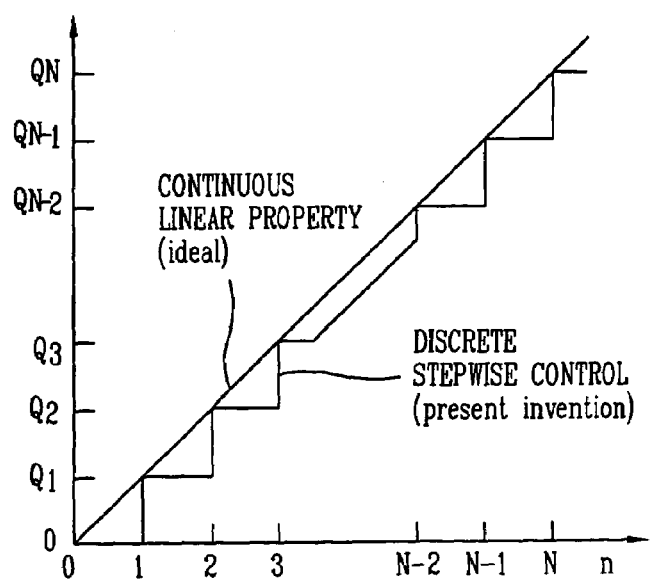
FIG. 14 is a graph showing a flow amount variation according to the number of micro-actuator arrays that open a fluid channel.

FIG. 14 is a graph showing a flow amount variation according to the number of micro-actuator arrays that open a micro-channel.

According to said graph, the horizontal axis denotes the number N of the micro-actuator arrays that the plug opens the micro-channel, the vertical axis denotes the flow amount variation when the plug opens the micro-channel, and the diagonal axis denotes an ideal continuous linear characteristic of the flow amount.

The graph shows that the flow amount is stepwise increased accordingly as the number N of the micro-actuators that open the micro-channel is gradually increased one by one. The micro-actuator array controls the flow amount as an N+1 state for the number N of the micro-actuators by making the flow amount passing through the micro-channel be discrete.

That is, in case of one micro-actuator, the flow amount is controlled according to two states of the micro-actuator, that is, a state that the micro-actuator is open and a state that the micro-actuator is closed.

Also, in case of two micro-actuators, the flow amount is controlled according to three states of the micro-actuators, that is, a state that all the micro-actuators are open, a state that all the micro-actuators are closed, and a state that one micro-actuator is open and another micro-actuator is closed.

The flow amount is controlled as an N+1 state for the number N of the micro-actuator.

Figure 15:
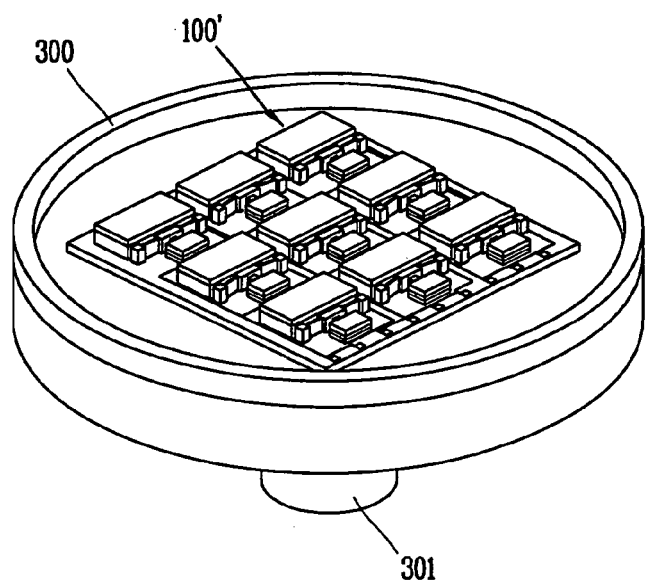
FIG. 15 is a perspective view showing a micro-actuator array of 3×3 mounted at a second valve housing.
Figure 16:
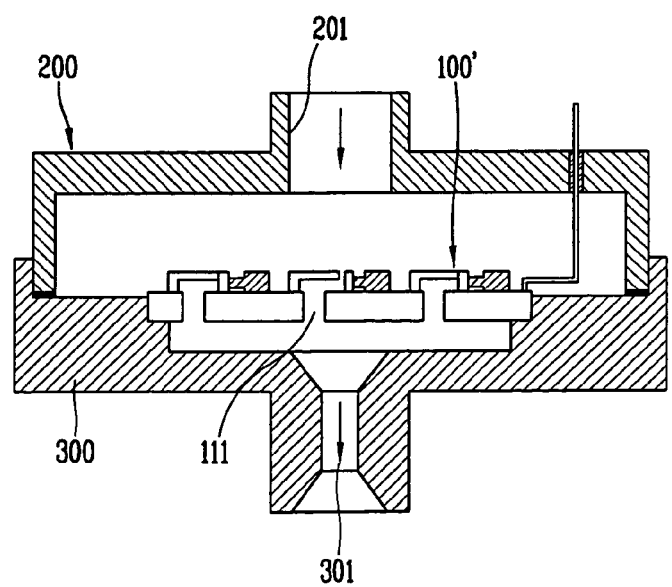
FIG. 16 is a longitudinal section view of a micro-actuating valve to which the micro-actuator array of 3×3 is applied.

FIG. 15 is a perspective view of a micro-actuator array of 3×3 mounted at the second valve housing, and FIG. 15 is a longitudinal section view showing a micro-actuating valve to which a micro-actuator array of 3×3 is applied.

Figure 17:
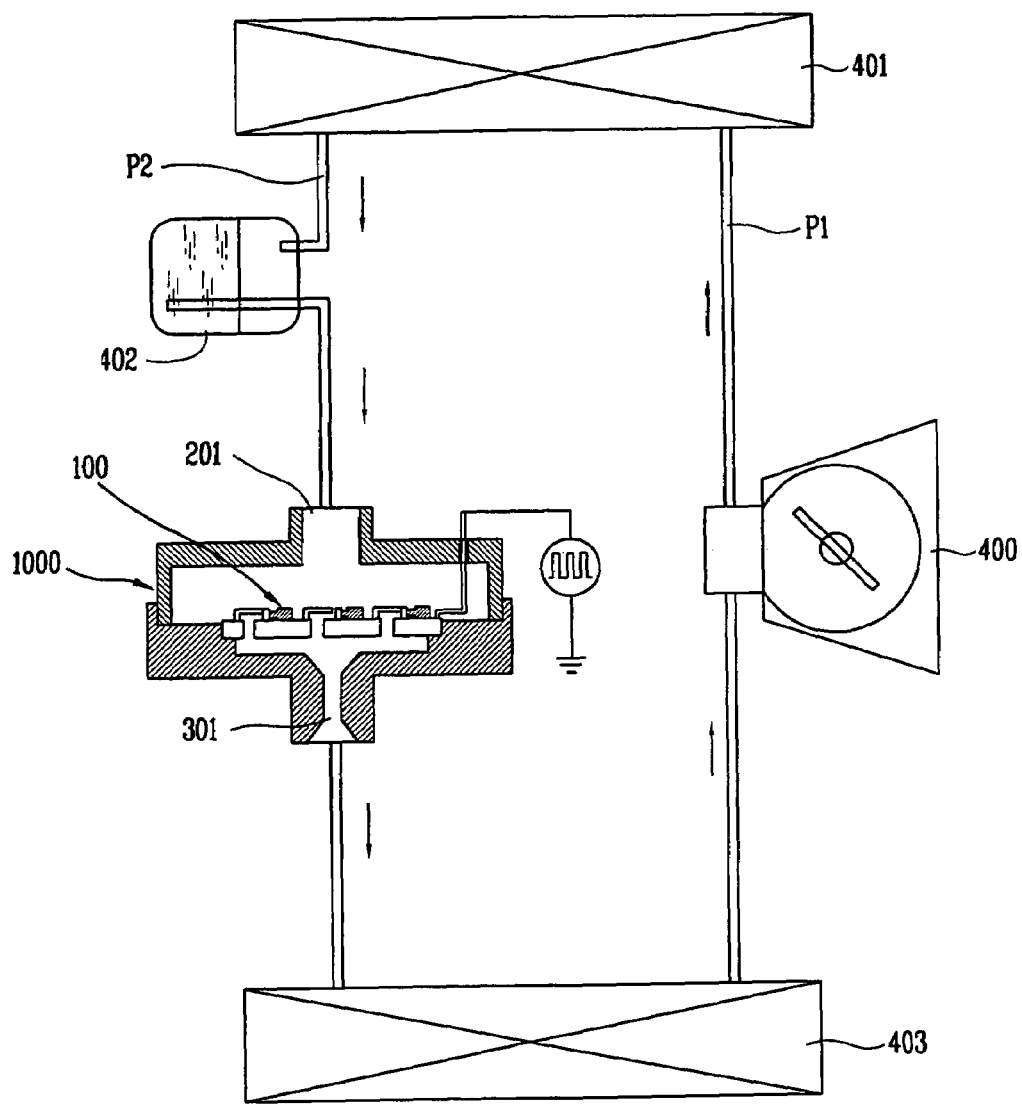
FIG. 17 is a construction view showing that the micro-actuating valve is applied to a heat exchanging system.

As shown, the fluid exit 301 of the second valve housing 300 has an orifice structure thus to be applied to a heat exchanging system of FIG. 17.

That is, a fluid introduced into the fluid entrance 201 of the first valve housing 200, that is, a refrigerant passes through the micro-actuator array 100' thereby to be discharged to the fluid exit 301 of the second valve housing 300 with expansion.

FIG. 17 is a construction view showing that the micro-actuating valve is applied to a heat exchanging system.

As shown, a refrigerant of a gaseous state compressed into a high pressure in a compression device 400 is introduced into a condensing device 401 through a channel pipe P1 thus to be condensed into a liquid state. The liquefied refrigerant passes through a refrigerant temporal storage container 402 through a channel pipe P2 thus to be introduced into the fluid entrance 201 of the micro-actuating valve 1000.

The refrigerant introduced into the fluid entrance 201, that is, the flow amount is properly controlled by the micro-actuating valve 1000 to which the micro-actuator array is applied thereby to pass through the fluid exist 301 having the orifice structure and then to be discharged to a vaporizer 403.

At this time, the refrigerant is changed into a state that the temperature is drastically lowered and the density is lowered by an adiabatic expansion principle thus to be introduced into the vaporizer 403, thereby taking away the peripheral heat from the vaporizer 403 and thereby performing a cooling operation.

Hereinafter, a micro-actuator and a micro-actuating valve to which the micro-actuator is applied according to the second embodiment of the present invention will be explained with reference to FIGS. 18 to 26.

FIGS. 18 to 23 are views showing a micro-actuator according to the second embodiment of the present invention.

Figure 18:
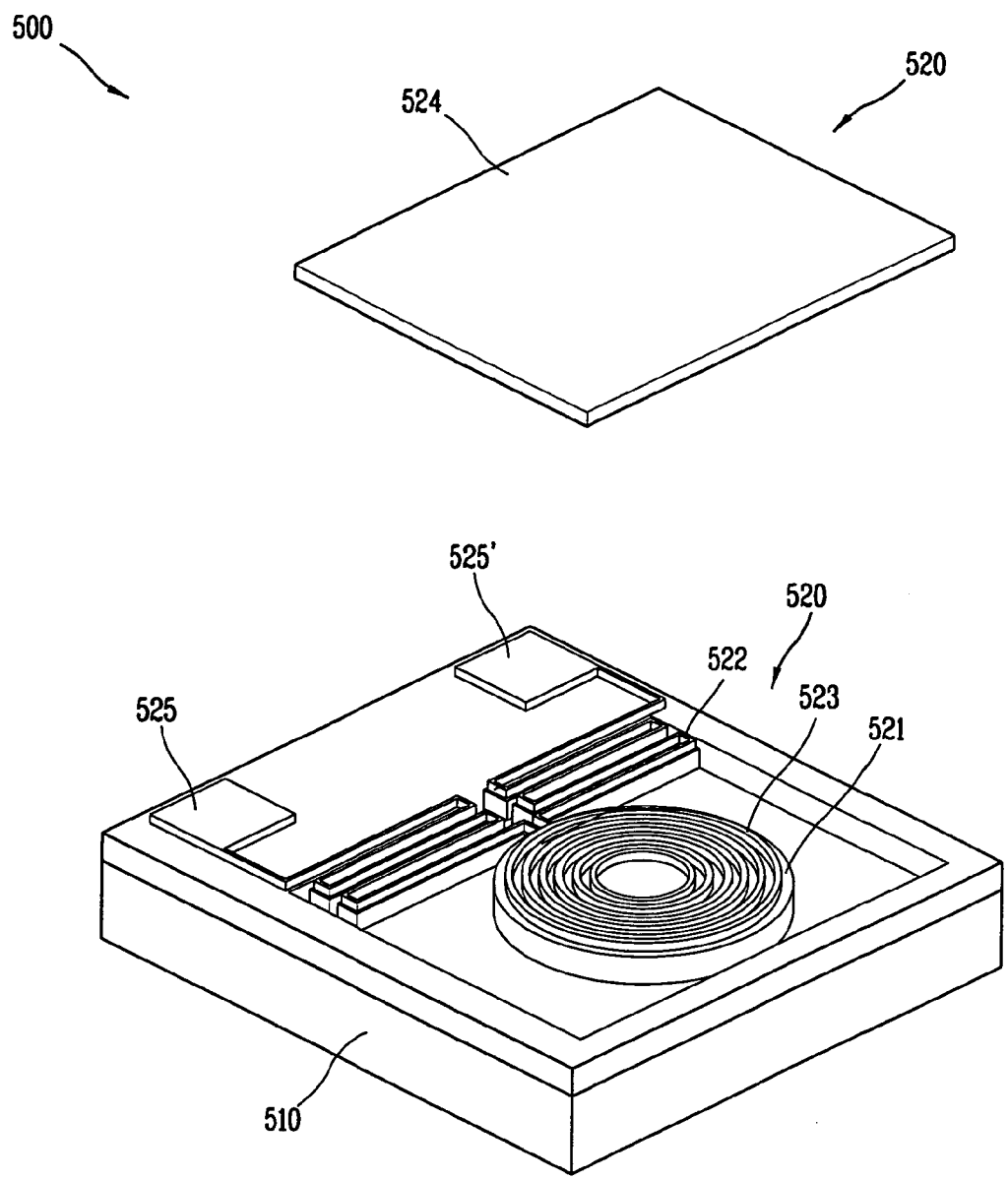
FIG. 18 is a perspective view showing a micro-actuator according to a second embodiment of the present invention, which shows a state that a micro-mover shields a micro-channel.
Figure 19:
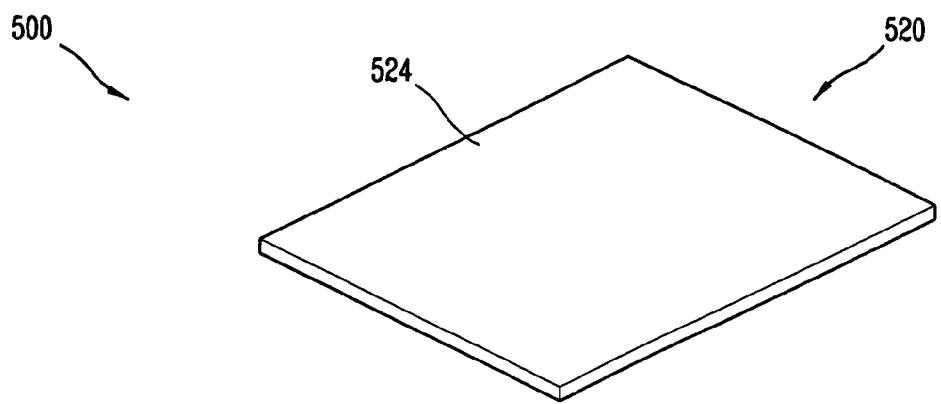
FIG. 19 is a perspective view showing the micro-actuator according to the second embodiment of the present invention, which shows a state that the micro-mover opens the micro-channel.
Figure 19:
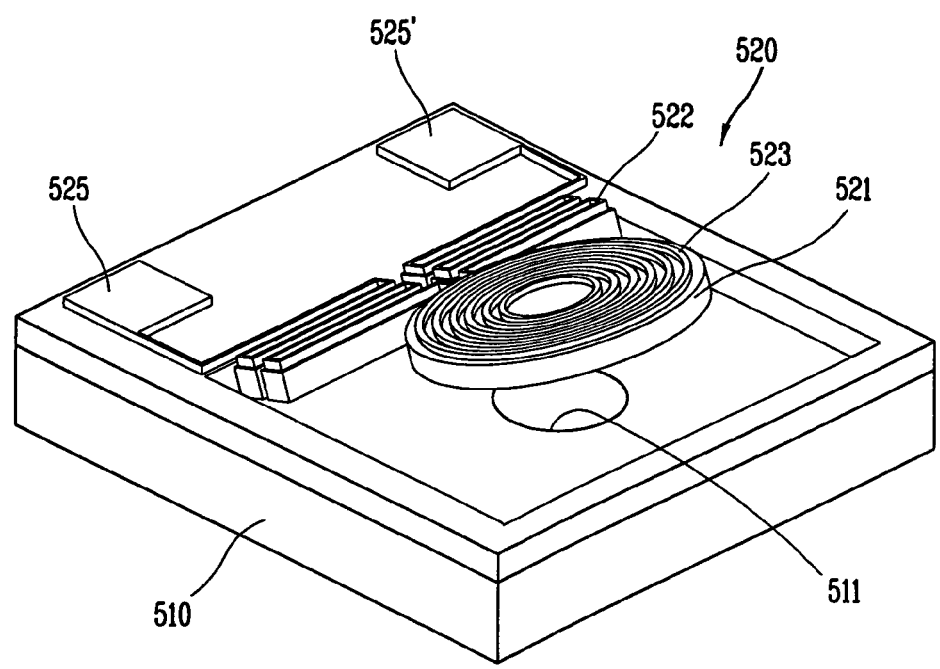
Figure 20:
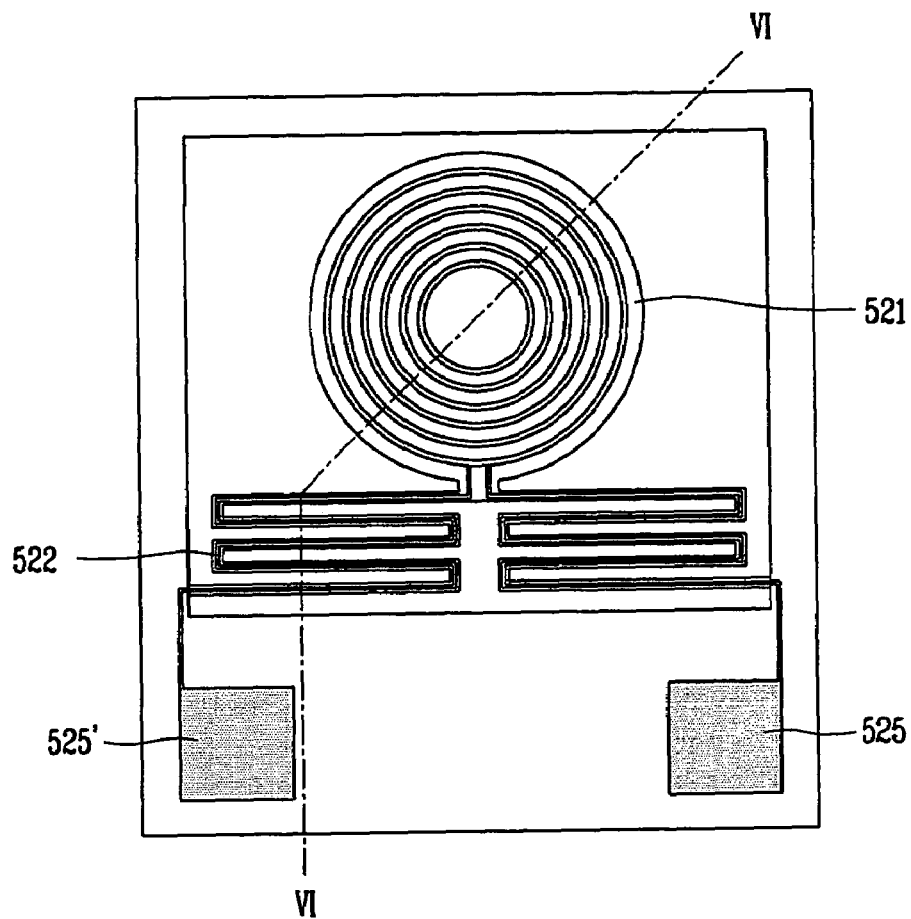
FIG. 20 is a plane view showing the micro-actuator according to the second embodiment of the present invention.
Figure 21:
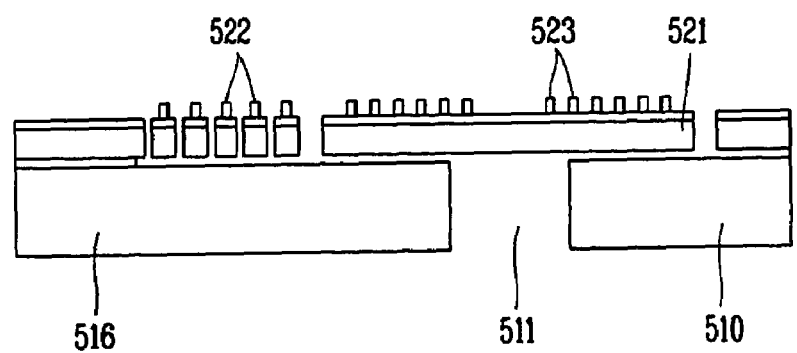
FIG. 21 is a section view taken along line VI—VI of FIG. 20.

FIG. 18 is a perspective view showing a micro-actuator according to the second embodiment of the present invention, which shows a state that a micro-mover shields a micro-channel; FIG. 19 is a perspective view showing the micro-actuator according to the second embodiment of the present invention, which shows a state that the micro-mover opens the micro-channel; FIG. 20 is a plane view showing the micro-actuator according to the second embodiment of the present invention; and FIG. 21 is a section view taken along line VI—VI of FIG. 20;

As shown, the micro-actuator 500 according to the second embodiment of the present invention comprises: a plate 510 having a micro-channel 511 at one side thereof; and a micro-driving means 520 installed to be near the plate 510 for selectively opening and closing the micro-channel 511 of the plate 510.

The micro-driving means 520 includes: a micro-mover 521 for opening and closing the micro-channel 511 of the plate 510; a micro-mover suspension 522 installed at the plate 510 for supporting the micro-mover 521; a coil 523 installed at the micro-mover 521; a magnet 524 installed with a certain gap from the coil 523; and an electrode portion 525 formed at the plate 510 for supplying a power source to the coil 523.

The micro-actuator 500 according to the second embodiment of the present invention uses an electromagnetic force generated by an interactive operation between a magnetic field of the magnet 524 and a current applied to the coil 523.

Since the coil 523 is fixed to the micro-mover 521, the micro-mover 521 becomes far from the micro-channel 511 by the electromagnetic force under the state of being supported at the micro-mover suspension 522. At this time, a fluid flows through the micro-channel 511.

By controlling the micro-mover 521 up and down in drawing by controlling a direction and a strength of the current applied to the coil 523, the micro-mover 521 properly opens or closes the micro-channel 511.

The micro-mover suspension 522 supports the micro-mover 521 and at the same time elastically restores the micro-mover 521 to the original position.

Figure 22:
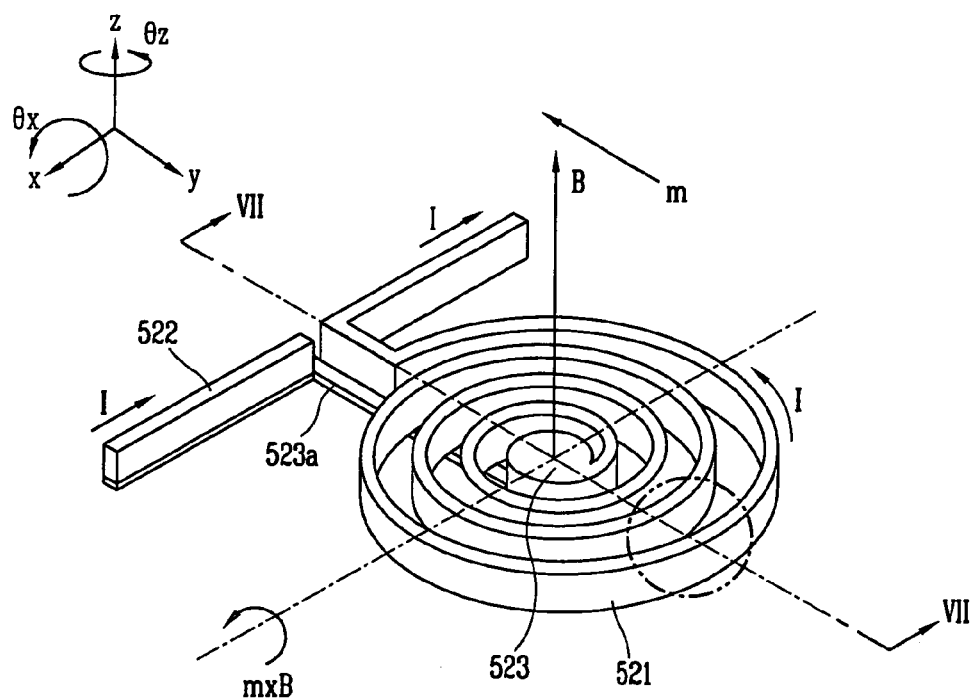
FIG. 22 is a perspective view showing a coil structure and an electromagnetic force.
Figure 23:
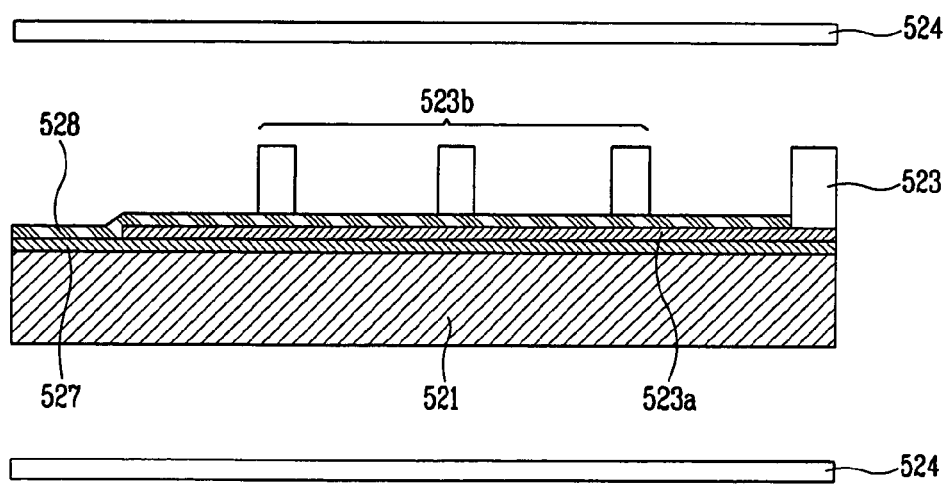
FIG. 23 is a section view taken along line VII—VII of FIG. 22.

FIG. 22 is a perspective view showing a coil structure and an electromagnetic force, and FIG. 23 is a section view taken along line VII—VII of FIG. 22.

As shown, the coil 523 includes: a first wire portion 523a for transmitting a current I of one electrode portion 525 to the center of the coil 523; and a second wire portion 523b for transmitting a current I flowing the center of the coil 523 to another electrode portion 525' (Refer to FIG. 19).

The first wire portion 523a and the second wire portion 523b are insulated by insulating layers 527 and 528.

That is, the first insulating layer 527 is positioned between the first wire portion 523a and the micro-mover 521 thus to insulate the first wire portion 523a, and the second insulating layer 528 is positioned between the first wire portion 523a and the second wire portion 523b thus to insulate the first wire portion 523a and the second wire portion 523b.

The current I flowing inside the coil 523 has the following path. The current I supplied from one electrode portion 525 is transmitted to the center of the coil 523 through the first wire portion 523a, and the current I transmitted to the center of the coil 523 flows to another electrode portion 525' through the second wire portion 523b.

At this time, the current I flowing inside the coil 523 interacts with a magnetic field of the magnet 524 installed at upper and lower portions of the coil 523 thus to generate a torque, thereby moving the micro-mover 521.

Figure 24:
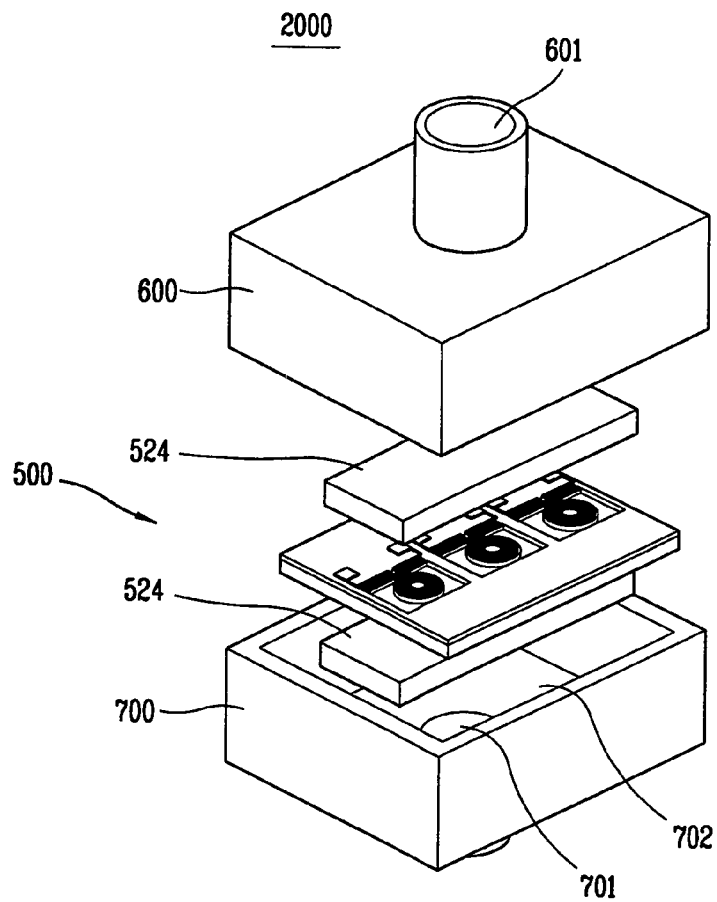
FIG. 24 is a disassembled perspective view showing a micro-actuating valve according to a second embodiment of the present invention.
Figure 25:
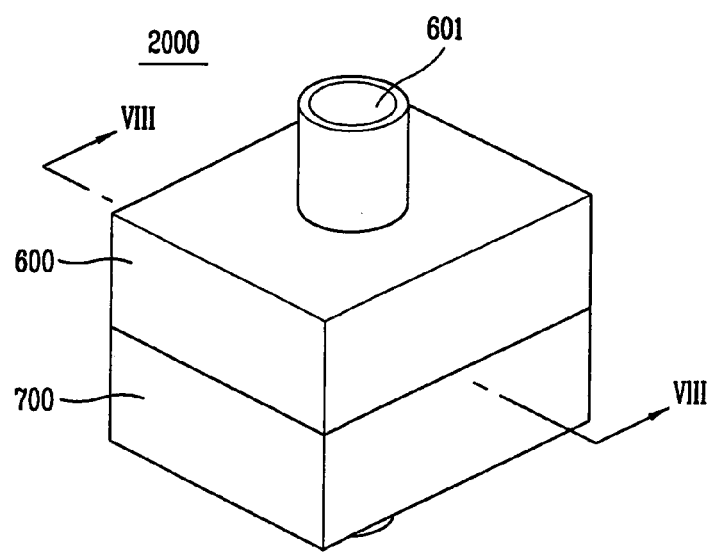
FIG. 25 is an engagement perspective view showing the micro-actuating valve according to the second embodiment of the present invention.

FIG. 24 is a disassembled perspective view showing a micro-actuating valve to which the micro-actuator is applied according to the second embodiment of the present invention; FIG. 25 is an engagement perspective view showing the micro-actuating valve to which the micro-actuator is applied according to the second embodiment of the present invention; and FIG. 26 is a section view taken along line VIII—VIII of FIG. 25, which shows a state that the micro-mover closes the micro-channel As shown, the micro-actuating valve 2000 to which the micro-actuator according to the second embodiment of the present invention is applied comprises: a first valve housing 600 having a fluid entrance 601 at the middle portion thereof; a second valve housing 700 coupled to the first valve housing 600 thus to form a space portion 702 therein and having a fluid exit 701 connected to the fluid entrance 601 of the first valve housing 600; and the micro-actuator 500 installed at the spacer portion 702 for selectively discharging a fluid introduced into the fluid entrance 601 to the fluid exit 701.

As shown in FIGS. 18 and 19, the micro-actuator 500 comprises: a plate 510 having a micro-channel 511 at one side thereof; a micro-mover 521 for opening and closing the micro-channel 511 of the plate 510; a micro-mover suspension 522 installed at the plate 510 for supporting the micro-mover 521; a coil 523 installed at the micro-mover 521; a magnet 524 installed with a certain gap from the coil 523; and electrode portions 525 and 525' formed at the plate 510 for supplying a power source to the coil 523.

Figure 26:
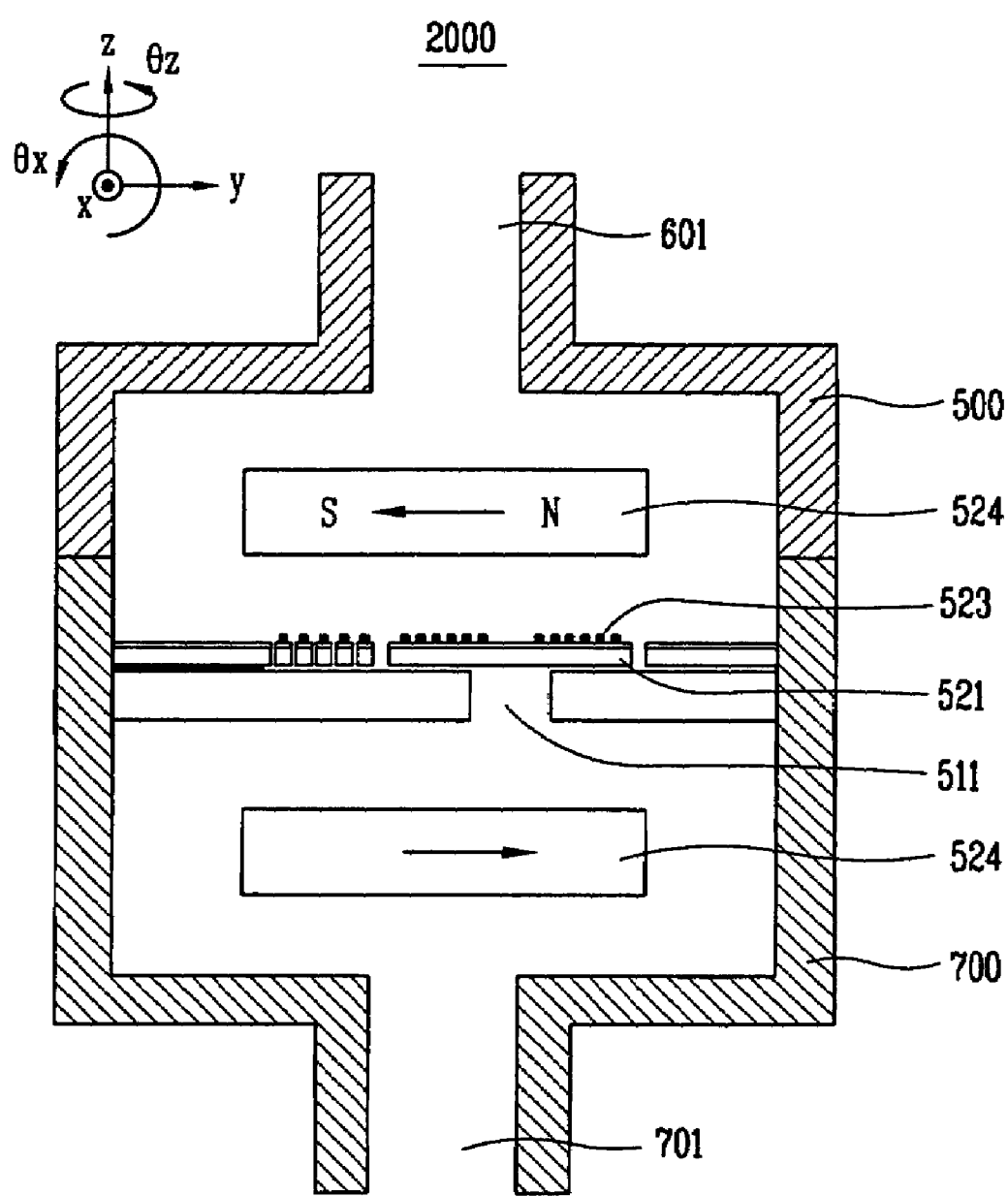
FIG. 26 is a section view taken along line VIII—VIII of FIG. 25, which shows a state that a micro-mover closes a micro-channel.

As shown in FIGS. 22 and 26, in the micro-actuating valve 2000 to which the micro-actuator is applied, a magnetic field intensity of the magnet 524 is supposed to be m, a magnetic field induced to the coil 523 by a current is supposed to be B, a current is supposed to be I, a rotation direction centering around the X axis is supposed to be Θx, a rotation direction centering around the Z axis is supposed to be Θz, and a magnetic flux direction of the magnet 524 is supposed to be the opposite direction to the y (a direction towards the S pole from the N pole).

In case of applying the current I in the θz direction, the end portion of the the micro-mover 521 (refer to the cycloid portion of FIG. 22) receives a force in the θx direction thus to be bent and thereby to open the micro-channel 511.

On the contrary, in case of applying the current I in the opposite direction to the θz direction, the end portion of the micro-mover 521 (refer to the cycloid portion of FIG. 22) receives a force in the opposite direction to the θx direction thus to be bent and thereby to close the micro-channel 511.

As aforementioned, by moving the micro-mover 521 by controlling the direction of the current applied to the coil 523, the fluid flowing to the fluid exit 701 of the second valve housing 700 from the fluid entrance 601 of the first valve housing 600 can be controlled.

In summary, according to the present invention, the entire construction is simplified thus to reduce the fabrication cost and the micro-actuator that can be minutely driven even with a low voltage can be easily fabricated. The micro-actuator is applied to the micro-actuating valve thus to efficiently control the flow amount of the fluid.

Additionally, the micro-actuating valve having the orifice structure is applied to the heat exchanging system thereby to enhance the function of the heat exchanging system.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A micro-actuator comprising:
a first plate having a micro-channel at one side thereof;
a second plate fixed to the first plate and having a micro-channel at one side thereof to be connected to the micro-channel of the first plate; and
a micro-driving means including:
a micro-mover installed at an upper surface of the second plate to be flexible to the micro-channel of the first plate;
an electrode portion formed at both sides of the micro-mover for supplying a power source to the micro-mover;
a plug formed at the end of the micro-mover for opening and closing the micro-channel of the second plate; and
a plug suspension for elastically supporting the plug.

2. The micro-actuator of claim 1, wherein the plug suspension is composed of:
a fixation portion fixed to the first plate; and
a connection portion for connecting the fixation portion and the plug.

3. A micro-actuating valve comprising:
a first valve housing having a fluid entrance at the middle portion thereof;
a second valve housing coupled to the first valve housing thus to form a space portion therein and having a fluid exit connected to the fluid entrance of the first valve housing; and
a micro-actuator installed at the space portion for selectively discharging a fluid introduced to the fluid entrance to the fluid exit
wherein the micro-actuator comprises:
a first plate having a micro-channel at one side thereof to be connected to the fluid exit;
a second plate fixed to the first plate and having a micro-channel at one side thereof to be connected to the micro-channel of the first plate;

a plurality of micro-driving members installed to be near the first plate and the second plate for discharging a fluid introduced from the fluid entrance of the first valve housing to the fluid exit of the second valve housing by selectively opening and closing the micro-channel of the second plate;

an electrode portion formed at both sides of the micro-mover for supplying a power source to the micro-mover;

a plug formed at the end of the micro-mover for opening and closing the micro-channel of the second plate; and a plug suspension for elastically supporting the plug.

4. The micro-actuating valve of claim 3, wherein the plug suspension is composed of:

a fixation portion fixed to the first plate; and a connection portion for connecting the fixation portion and the plug.

5. The micro-actuating valve of claim 3 further comprising a mounting groove formed at an inner surface of the first valve housing for mounting the first plate.

6. The micro-actuating valve of claim 3, wherein a gasket is installed at a contact surface between the first valve housing and the second valve housing.

7. The micro-actuating valve of claim 3, wherein the electrode portion is composed of:

an electrode pad connected to the micro-mover; and an electrode feeder connected to the electrode pad and extended towards outside of the first valve housing.

8. The micro-actuating valve of claim 7, wherein the electrode feeder is insulated by an insulating material.

9. A method for fabricating a micro-actuator comprising the steps of:

a first step of patterning an etching mask for forming a valve plug and a micro-mover at an upper surface of a silicon member having a wafer form and to be used as a first substrate, simultaneously patterning the etching mask for forming a micro-suspension gap at a lower surface of the silicon member, forming a micro-suspension gap by partially etching the silicon member exposed between the etching masks of the lower surface of the silicon member, and then removing the etching mask;

a second step of patterning an etching mask for forming a bonding portion and a micro-channel at the lower surface of the silicon member, forming a micro-channel by partially etching the silicon member exposed between the etching masks, and then removing the etching mask;

a third step of depositing a conductive thin film at a lower surface of a silicon member having a wafer form and to be used as a second substrate;

a fourth step of patterning an etching mask on the conductive thin film for forming an electrode portion, forming an electrode portion by partially etching the conductive thin film exposed between the etching masks, and then removing the etching mask;

a fifth step of forming a micro-channel at the silicon member of the fourth step;

a sixth step of bonding the silicon member of the second step and the silicon member of the fifth step by an alignment;

a seventh step of forming a valve plug and a micro-mover by partially etching the silicon member exposed between the etching masks patterned at the upper surface of the silicon member of the first step up to the bonding part of the sixth step, then removing the etching mask, and thereby forming a plurality of micro-actuators; and an eighth step of fabricating a micro-actuator array by cutting the micro-actuators as a chip unit.

10. The method of claim 9, wherein the micro-actuator array becomes discrete as an N+1 state for the number N of the micro-actuators thereby to control a flow amount.

11. A micro-actuator comprising:

a plate having a micro-channel at one side thereof; and a micro-driving means including:

a micro-mover for opening and closing the micro-channel of the plate;

a micro-mover suspension installed at the plate for supporting the micro-mover;

a coil installed at the micro-mover;

a magnet installed with a certain gap from the coil; and an electrode portion formed at the plate for supplying a power source to the coil.

12. A micro-actuating valve comprising:

a first valve housing having a fluid entrance at the middle portion thereof;

a second valve housing coupled to the first valve housing thus to form a space portion therein and having a fluid exit connected to the fluid entrance of the first valve housing;

a plate installed at the space portion and having a micro-channel at one side thereof to be connected to the fluid exit;

a plurality of micro-driving members installed to be near the plate for discharging a fluid introduced from the fluid entrance of the first valve housing to the fluid exit of the second valve housing by selectively opening and closing the micro-channel of the plate a micro-mover suspension installed at the plate for supporting the micro-mover;

a coil installed at the micro-mover;

a magnet installed with a certain gap from the coil; and an electrode portion formed at the plate for supplying a power source to the coil.

* * * * *